(12) United States Patent
Lee et al.

(10) Patent No.: US 11,745,641 B2
(45) Date of Patent: Sep. 5, 2023

(54) VEHICLE LAMP AND METHOD FOR MANUFACTURING SAME

(71) Applicant: LG CHEM, LTD., Seoul (KR)

(72) Inventors: Junhaeng Lee, Daejeon (KR); Deok Hwan Kim, Daejeon (KR); Yeon Keun Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/734,475

(22) PCT Filed: Oct. 31, 2019

(86) PCT No.: PCT/KR2019/014565
§ 371 (c)(1),
(2) Date: Dec. 2, 2020

(87) PCT Pub. No.: WO2020/091444
PCT Pub. Date: May 7, 2020

(65) Prior Publication Data
US 2021/0221279 A1    Jul. 22, 2021

(30) Foreign Application Priority Data
Nov. 1, 2018   (KR) .......................... 10-2018-0132918

(51) Int. Cl.
| | | |
|---|---|---|
| *B60Q 1/08* | (2006.01) | |
| *F21S 41/143* | (2018.01) | |
| *F21S 41/20* | (2018.01) | |
| *B05D 5/06* | (2006.01) | |
| *B05D 7/24* | (2006.01) | |
| *B60Q 1/00* | (2006.01) | |
| *C09D 5/00* | (2006.01) | |
| *C09D 183/04* | (2006.01) | |
| *G02B 5/20* | (2006.01) | |
| *F21S 41/141* | (2018.01) | |

(52) U.S. Cl.
CPC ............... *B60Q 1/085* (2013.01); *B05D 5/06* (2013.01); *B05D 7/24* (2013.01); *B60Q 1/0041* (2013.01); *C09D 5/00* (2013.01); *C09D 183/04* (2013.01); *F21S 41/143* (2018.01); *F21S 41/20* (2018.01); *G02B 5/20* (2013.01); *F21S 41/141* (2018.01)

(58) Field of Classification Search
None
See application file for complete search history.

(56) References Cited

U.S. PATENT DOCUMENTS

| | | |
|---|---|---|
| 6,214,623 B1 | 4/2001 | Simons et al. |
| 6,319,425 B1 | 11/2001 | Tasaki et al. |
| 8,274,208 B2 | 9/2012 | Miyake et al. |
| (Continued) | | |

FOREIGN PATENT DOCUMENTS

| | | |
|---|---|---|
| CN | 102809846 A | 12/2012 |
| CN | 103797294 A | 5/2014 |
| (Continued) | | |

*Primary Examiner* — Michael P. Rodriguez
(74) *Attorney, Agent, or Firm* — Bryan Cave Leighton Paisner LLP

(57) ABSTRACT

A vehicle lamp and a method for manufacturing a vehicle lamp. The vehicle lamp includes a lower substrate, a fluorescent film and a color filter stacked in this order. The fluorescent film and the color filter include polydimethylsiloxane (PDMS).

7 Claims, 2 Drawing Sheets

(56) References Cited

U.S. PATENT DOCUMENTS

| | | | |
|---|---|---|---|
| 8,395,169 B2 | 3/2013 | Hikosaka et al. | |
| 9,835,925 B1 | 12/2017 | Bull et al. | |
| 2003/0203212 A1 | 10/2003 | Wei et al. | |
| 2007/0246734 A1* | 10/2007 | Lee | C09K 11/025 257/103 |
| 2012/0307191 A1 | 12/2012 | Park et al. | |
| 2014/0191273 A1 | 7/2014 | Van Bommel et al. | |
| 2015/0054401 A1 | 2/2015 | Van Bommel et al. | |
| 2015/0291876 A1 | 10/2015 | Koole et al. | |
| 2016/0195229 A1 | 7/2016 | Tokinoya | |
| 2016/0300745 A1 | 10/2016 | Chang et al. | |
| 2016/0320547 A1 | 11/2016 | Li et al. | |
| 2018/0012949 A1 | 1/2018 | Takeya et al. | |
| 2018/0112846 A1* | 4/2018 | Jo | B60Q 1/0058 |
| 2018/0187071 A1 | 7/2018 | Zhou et al. | |
| 2020/0044189 A1 | 2/2020 | Naganawa et al. | |

FOREIGN PATENT DOCUMENTS

| | | | | |
|---|---|---|---|---|
| CN | 104755586 A | | 7/2015 | |
| CN | 105694042 A | | 6/2016 | |
| CN | 105968812 A | | 9/2016 | |
| CN | 106058001 A | | 10/2016 | |
| EP | 0930488 A2 | | 7/1999 | |
| JP | 07130471 A | | 5/1995 | |
| JP | 11087784 A | * | 3/1999 | F21V 17/04 |
| JP | 11087784 A | | 3/1999 | |
| JP | 2007169345 A | * | 7/2007 | |
| JP | 2007169345 A | | 7/2007 | |
| JP | 2007-281484 A | | 10/2007 | |
| JP | 2007266356 A | * | 10/2007 | |
| JP | 2007266356 A | | 10/2007 | |
| JP | 2009086468 A | * | 4/2009 | |
| JP | 2009086468 A | | 4/2009 | |
| JP | 2011208109 A | | 10/2011 | |
| JP | 2013168658 A | | 8/2013 | |
| JP | 2018049971 A | | 3/2018 | |
| KR | 10-20090091030 A | | 8/2009 | |
| KR | 10-1186388 B1 | | 9/2012 | |
| KR | 10-20130140302 A | | 12/2013 | |
| KR | 10-20170091505 A | | 8/2017 | |
| KR | 10-2018-0003239 A | | 1/2018 | |
| KR | 10-20180076264 A | | 7/2018 | |
| KR | 10-20180086282 A | | 7/2018 | |
| TW | 200628988 A | | 8/2006 | |
| WO | 2017057454 A1 | | 4/2017 | |
| WO | 2018088387 A1 | | 5/2018 | |

* cited by examiner

[FIG. 1]
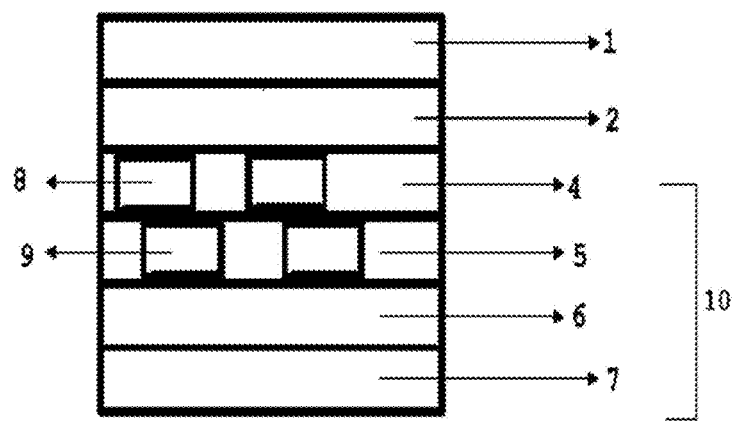
[FIG. 2]
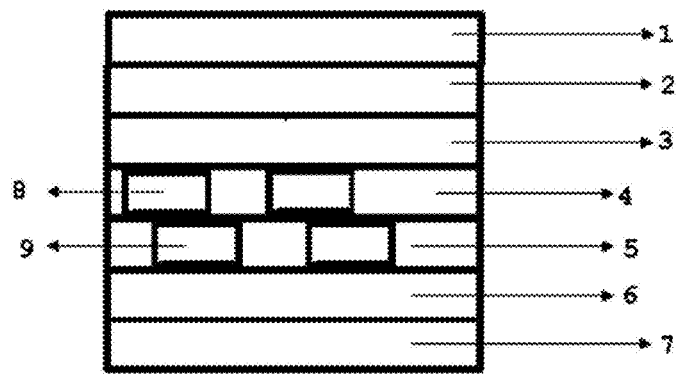

[FIG. 3]
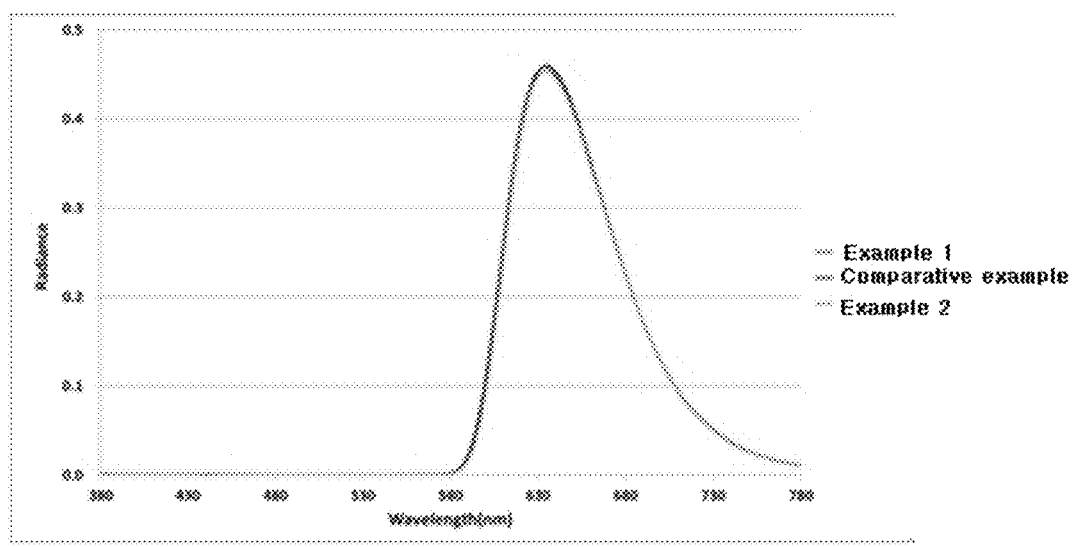

VEHICLE LAMP AND METHOD FOR MANUFACTURING SAME

CROSS-REFERENCE TO RELATED APPLICATIONS

This application is a U.S. national stage of international Application No. PCT/KR2019/014565 filed on Oct. 31, 2019, and claims priority to and the benefits of Korean Patent Application No. 10-2018-0132918, filed with the Korean Intellectual Property Office on Nov. 1, 2018, the entire contents of which are incorporated herein by reference.

TECHNICAL FIELD

The present application relates to a vehicle lamp and a method for manufacturing the same.

BACKGROUND

Vehicles comprise a variety of vehicle lamps performing illumination or signaling functions. In general, halogen lamps or gas discharge lamps have been mainly used, but in recent years, light-emitting diodes (LEDs) have attracted attention as light sources for vehicle lamps.

In the case of light-emitting diodes, the design freedom of lamps can be increased by minimizing the size of light-emitting diodes, and light-emitting diodes are economically efficient due to the semi-permanent life thereof. A light-emitting diode (LED), which is not in the form of a package, is a semiconductor light-emitting device that converts current to light and is continually being developed as a light source for display images of electronic devices comprising information communication devices.

In the product using a micro LED technology as a vehicle lamp, the upper substrate usually comprises a light-diffusing layer/fluorescent layer/color filter layer. In this case, the light-diffusing layer and the fluorescent layer use PDMS as a material and the color filter layer uses a dispersed pigment to minimize the loss of luminance.

In this case, a comma coater capable of coating the light-diffusing layer and the fluorescent layer cannot be used due to the low viscosity resulting from the presence of the solvent for dispersion. For this reason, other types of coaters such as slot dies are generally used, and the curing time is lengthened, thereby resulting in problems such as increased processing costs and time delays. In addition, the light-diffusing layer, the fluorescent layer and the color filter layer contain different kinds of binders, thereby disadvantageously resulting in a high possibility of deformation such as warping or twisting.

Thus, there is a need for vehicle lamps that can be manufactured with the same coater and advantageously resist deformation such as warping or twisting by using the same binder for different layers.

RELEVANT REFERENCE

Korean Patent Laid-open No. 10-2018-0086282

SUMMARY

The present application is directed to providing a vehicle lamp and a method for manufacturing the same.

One exemplary embodiment of the present application provides a vehicle lamp having a structure in which a lower substrate, a fluorescent film and a color filter are stacked in this order, wherein the fluorescent film and the color filter comprise polydimethylsiloxane (PDMS).

Another exemplary embodiment of the present application provides a method for manufacturing a vehicle lamp comprising preparing a lower substrate, forming a fluorescent film on one surface of the lower substrate, and forming a color filter on an opposite surface to a surface of the fluorescent film in contact with the lower substrate, wherein the fluorescent film and the color filter comprise polydimethylsiloxane (PDMS).

In the vehicle lamp according to one exemplary embodiment of the present application, the fluorescent film and the color filter comprise the same binder of polydimethylsiloxane (PDMS), thereby providing an advantage with respect to the manufacturing process in that the color filter can be directly coated on the fluorescent film without using a solvent and a dispersant.

In addition, the vehicle lamp according to one exemplary embodiment of the present application contains the same material in the light-diffusing layer, the fluorescent film and the color filter, thereby advantageously resisting deformation of the final laminate such as warping and twisting.

BRIEF DESCRIPTION OF DRAWINGS

FIG. 1 is a side view illustration of a vehicle lamp according to one exemplary embodiment of the present application.

FIG. 2 is a side view illustration of a vehicle lamp according to another exemplary embodiment of the present application.

FIG. 3 is a graphical representation of the dominant wavelength of a vehicle lamp according to Example 1, Example 2 and Comparative Example 1 of the present application

REFERENCE NUMERALS USED HEREIN

1: Color filter
2: Fluorescent film
3: Light-diffusing layer
4: Second insulating film
5: First insulating film
6: First electrode
7: Substrate
8: Second electrode
9: Light-emitting element
10: Lower substrate

DETAILED DESCRIPTION

Hereinafter, the present specification will be described in more detail.

In the present specification, it will be understood that, when a portion is referred to as "comprising" one element, the portion may further comprise another element, and does not preclude the presence thereof unless clearly indicated otherwise.

Hereinafter, specific embodiments of the present invention will be described in more detail with reference to the attached drawings such that those skilled in the art to which the present invention pertains can easily implement the embodiments. However, the present invention can be implemented in various forms and is not limited to the embodiments described herein.

One exemplary embodiment of the present application provides a vehicle lamp having a structure in which a lower substrate, a fluorescent film and a color filter are stacked in this order, wherein the fluorescent film and the color filter comprise polydimethylsiloxane (PDMS).

In the vehicle lamp according to one exemplary embodiment of the present application, the fluorescent film and the color filter comprise the same binder of polydimethylsiloxane (PDMS), thereby providing an advantage with respect to the manufacturing process in that the color filter can use a pigment, instead of a solvent and a dispersant, and can be directly coated on the fluorescent film.

In particular, the vehicle lamp according to one exemplary embodiment of the present application, the material included in the fluorescent film and the color filter is the same, thereby advantageously resisting deformation, such as warping and twisting, of the final laminate. That is, conventional color filter layers use a dispersed pigment to minimize loss of luminance. Such conventional color filter layers use an acrylic binder as a binder material and comprise a solvent for dispersion, thereby resulting in problems of increased manufacturing costs due to the low viscosity and high possibility of deformation such as warping and twisting of the final laminate because the acrylic binder used as the color filter layer is different from the material for the fluorescent film. However, the vehicle lamp according to the present application comprises polydimethylsiloxane as the material for the color filter, thereby solving the problems described above.

In one exemplary embodiment of the present application, the lower substrate has a structure in which a substrate, a first electrode, a first insulating film comprising a light-emitting to element and a second insulating film comprising a second electrode are stacked in this order, wherein an opposite surface to a surface of the second insulating film in contact with the first insulating film and an opposite surface to a surface of the fluorescent film in contact with the color filter are in contact with each other.

In one exemplary embodiment of the present application, the substrate may be a wiring substrate in which the first electrode is disposed.

The first electrode may be an anode and the first electrode may be a cathode.

In one exemplary embodiment of the present application, the substrate is selected from the group consisting of polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbonene, polyethersulphone (PES) and a cycloolefin polymer (COP).

The substrate may comprise glass or polyimide (PI) to realize a flexible light source. In addition, the substrate may be a thin metal. In addition, any material may be used for the substrate as long as it is insulating and flexible. In addition, the substrate may be either a transparent material or an opaque material.

In one exemplary embodiment of the present application, the substrate may comprise polyimide (PI).

In one exemplary embodiment of the present application, the first insulating film may comprise a plurality of light-emitting elements.

FIG. 1 is a side view illustrating a vehicle lamp according to one exemplary embodiment of the present application. Specifically, the light-emitting elements 9 may be provided in the first insulating film 5, and specifically, the light-emitting elements may be provided in the form of a pattern inside the first insulating film.

In one exemplary embodiment of the present application, the second insulating film may comprise a plurality of second electrodes.

FIG. 1 is a side view illustrating a vehicle lamp according to one exemplary embodiment of the present application. Specifically, the second electrodes 8 may be provided in the second insulating film 4, and specifically, the second electrodes may be provided in the form of a pattern inside the second insulating film.

In one exemplary embodiment of the present application, one surface of the plurality of second electrodes may be disposed on a portion of one surface of each of the plurality of light-emitting elements, and the plurality of second electrodes may be electrically connected to respective ones of the plurality of light-emitting elements.

In one exemplary embodiment of the present application, the first insulating film and the second insulating film may be a transparent insulating film comprising silicon oxide ($SiO_x$) or the like. In another exemplary embodiment, the insulating film has a structure that is capable of preventing a short between electrodes, and uses a polymer material such as epoxy or methyl, phenyl-based silicone, or an inorganic material such as SiN or $Al_2O_3$, which has high insulating property and low light absorption property.

The first insulating film and the second insulating film may serve to prevent a short between the first electrode and the second electrode.

The second electrode may be a cathode and the second electrode may be an anode.

As the material for the anode, materials having a relatively large work function may be used, and a transparent conductive oxide, a metal, a conductive polymer and the like may be used. Specific examples of the anode material comprise, but are not limited to: metals such as vanadium, chromium, copper, zinc and gold or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like.

As the material for the cathode, materials having a relatively low work function may be used, and a metal, a metal oxide, a conductive polymer or the like may be used. Specific examples of the cathode material comprise, but are not limited to: metals such as magnesium, calcium, sodium, potassium, titanium, indium, yttrium, lithium, gadolinium, aluminum, silver, tin and lead or alloys thereof; multilayer-structured materials such as LiF/Al or $LiO_2$/Al, and the like.

In one exemplary embodiment of the present application, there is provided a vehicle lamp further comprising a light-diffusing layer provided between the lower substrate and the fluorescent film.

FIG. 2 is a side view illustrating a vehicle lamp according to another exemplary embodiment of the present application. As illustrated in FIG. 2, the vehicle lamp further comprises the light-diffusing layer 3. In this case, one surface of the second electrode 8 may be in contact with one surface of the light-diffusing layer 3.

The light-diffusing layer may comprise polydimethylsiloxane (PDMS).

When the vehicle lamp according to the exemplary embodiment of the present application comprises the light-diffusing layer, the light-diffusing layer is provided between the light-emitting element and the fluorescent film to form a gap between the light-emitting element and the fluorescent film, to thereby more effectively conceal the light-emitting element.

When the light-emitting element is poorly concealed, the light emitted from the vehicle lamp passes through the color filter, which is different from surface light emission and enables each light-emitting element to be individually distinguished.

In one exemplary embodiment of the present application, the light-diffusing layer may have a thickness of 100 μm or more and 1,000 μm or less.

In another exemplary embodiment, the light-diffusing layer may have a thickness of 100 μm or more and 1,000 μm or less, preferably 200 μm or more and 800 μm or less, more preferably 400 μm or more and 600 μm or less.

When the thickness of the light-diffusing layer satisfies the predetermined range, the concealment of the light-emitting element may be improved and a transparent material may be used to prevent color conversion or luminance loss.

In one exemplary embodiment of the present application, the fluorescent film may comprise polydimethylsiloxane and a fluorescent material.

The fluorescent film may be formed on one surface of the second insulating film.

The fluorescent film comprises a fluorescent material, thereby serving to absorb a part of the light emitted from the light-emitting elements and to emit light of a predetermined color different from the absorbed light.

For example, the light-emitting element may be a blue semiconductor light-emitting element that emits blue (B) light and may be provided with a fluorescent film for converting the blue (B) light into light of another color. The fluorescent film may convert a red fluorescent material capable of converting blue light into red (R) light, a green fluorescent material capable of converting blue light into green (G) light, or a white fluorescent material capable of converting blue light into white (W) light.

In one exemplary embodiment of the present application, the green fluorescent material may be a silicate-, nitride- or sulfide-based phosphor.

In one exemplary embodiment of the present application, the red fluorescent material may be a nitride-, sulfide- or fluoride-based phosphor.

In one exemplary embodiment of the present application, the white fluorescent material may be suitably used as an efficient mixture of the green and red fluorescent materials.

In one exemplary embodiment of the present application, the fluorescent film may have a thickness of 100 μm or more and 1,000 μm or less.

In another exemplary embodiment, the fluorescent film may have a thickness of 100 μm or more and 1,000 μm or less, preferably 100 μm or more and 800 μm or less, more preferably 100 μm or more and 650 μm or less.

When the fluorescent film is within the predetermined thickness range, the properties thereof are suitable for converting the color of light emitted from the light-emitting element into another color of light and improving concealment of the light-emitting element.

In order to convert the light emitted from the light-emitting elements into light of the desired color of the fluorescent film containing a fluorescent material, and convert all the light to the desired light, the content of the fluorescent material included in the fluorescent film and the thickness of the fluorescent film should be controlled. In particular, the fluorescent film has the predetermined thickness range, thereby minimizing the loss of luminance and at the same time converting as much light as possible into a desired color.

In one exemplary embodiment of the present application, the color filter may comprise polydimethylsiloxane (PDMS) and a pigment.

In another exemplary embodiment of the present application, the polydimethylsiloxane may be EI-1184 or Sylgard 184 produced by Dow Corp., or a commercially available product such as KE-106 or KE-109 produced by Shin-etsu Chemical Co., Ltd., which has excellent light transmittance and superior light resistance, and is cured at a high speed after being coated.

The color filter may be stacked on the fluorescent film and may serve to selectively transmit light of a predetermined color emitted from the fluorescent film.

Conventional color filters are prepared by dispersing the pigment contained in the color filter and then applying an acrylic binder thereto in order to minimize the loss of luminance. In this case, the solvent inevitably included for dispersion lowers the viscosity, thereby making it difficult to directly coat the color filter on the fluorescent film and requiring coating of the color filter with a substrate film and then applying the same to the fluorescent film.

The color filter according to an exemplary embodiment of the present application comprises a polydimethylsiloxane (PDMS) material, and can be directly coated on a fluorescent film, which allows for dispersion of a pigment without using a solvent or a dispersant.

In one exemplary embodiment of the present application, the pigment may be used as a red dye alone or a mixture of red and yellow dyes. The pigment, which is included in the color filter, may be an appreciate dye selected depending on the desired light emission color of a final vehicle lamp, and may specifically comprise one or a combination of two or more selected from C.I. Pigment Red-a (a: one of 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279) and C.I. Pigment yellow-b (b: one of 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 and 214).

One exemplary embodiment of the present application provides a vehicle lamp wherein the color filter has a thickness of 50 μm or more and 150 μm or less.

In another exemplary embodiment, the color filter may have a thickness of 50 μm or more and 150 μm or less, more preferably 60 μm or more and 130 μm or less, and more preferably 80 urn or more and 110 urn or less.

The transmittance of the color filter changes depending on the thickness of the color filter, which plays an important role in determining the luminance, dominant wavelength and color purity of the light finally passing through the color filter. That is, when the thickness of the color filter satisfies the predetermined range, the color filter can achieve the highest luminance while satisfying the dominant wavelength and the color purity.

The vehicle lamp according to one exemplary embodiment of the present application contains the same material in the light-diffusing layer, the fluorescent film and the color filter, thereby having characteristics advantageous for resisting deformation such as warping and twisting of the final vehicle lamp laminate.

Specifically, in the vehicle lamp according to one exemplary embodiment of the present application, the polymer material used in the light-diffusing layer, the fluorescent film and the color filter is the same, the polymer may be a methyl- or phenyl-based silicone polymer, and the methyl- or phenyl-based silicone polymer may be the aforementioned polydimethylsiloxane.

One exemplary embodiment of the present application provides a vehicle lamp wherein the color filter comprises a pigment, wherein the pigment is present in an amount of 0.5 parts by weight to 2 parts by weight based on 100 parts by weight of the polydimethylsiloxane (PDMS).

In another exemplary embodiment, the color filter comprises a pigment, wherein the pigment is present in an amount of 0.5 to 2 parts by weight, preferably 0.5 to 1.5 parts by weight, and more preferably 0.5 to 1.0 parts by weight based on 100 parts by weight of polydimethylsiloxane (PDMS).

The transmittance of the vehicle lamp is changed depending on the content of the pigment contained in the color filter. When the pigment is present in the above-discussed amounts in the color filter, an appropriate level of haze caused by the pigment particles is generated and the light emitted from the light-emitting element is scattered without affecting luminance, thereby improving the concealment of each light-emitting element.

In one exemplary embodiment of the present application, the level of haze may be 30% or more and 60% or less.

One exemplary embodiment of the present application provides a vehicle lamp wherein the fluorescent film comprises a fluorescent material, and the fluorescent material is present in an amount of 5 parts by weight to 50 parts by weight, based on 100 parts by weight of the polydimethylsiloxane (PDMS).

In another exemplary embodiment, the fluorescent film may comprise a fluorescent material and the fluorescent material may be present in an amount of 5 parts by weight to 50 parts by weight, preferably 10 parts by weight to 50 parts by weight, more preferably 20 to 50 parts by weight based on 100 parts by weight of the polydimethylsiloxane (PDMS).

In order for the fluorescent film comprising the fluorescent material to convert the light emitted from the light-emitting elements into light of a desired color and convert all the light into the light of a desired color, the content and thickness of the fluorescent material are controlled. That is, because the fluorescent film comprises the fluorescent material in the content of the corresponding weight part, it is capable of minimizing loss of luminance and converting as much light as possible into light of a desired color. The thickness range of the fluorescent film is the same as described above.

Another exemplary embodiment of the present application provides a method for manufacturing a vehicle lamp comprising preparing a lower substrate, forming a fluorescent film on one surface of the lower substrate, and forming a color filter on an opposite surface to a surface of the fluorescent film in contact with the lower substrate, wherein the fluorescent film and the color filter comprise polydimethylsiloxane (PDMS).

In one exemplary embodiment of the present application, the step of preparing a lower substrate may comprise preparing a substrate, forming a first electrode on one surface of the substrate, forming a first insulating film comprising a light-emitting element on an opposite surface to a surface of the first electrode in contact with the substrate, and forming a second insulating film comprising a second electrode on an opposite surface to a surface of the first insulating film in contact with the first electrode.

In one exemplary embodiment of the present application, the step of forming a color filter to may comprise preparing a color filter composition containing polydimethylsiloxane (PDMS) and a pigment, and directly coating the color filter composition on one surface of the fluorescent film.

The color filter composition comprises polydimethylsiloxane (PDMS) and a pigment, and may comprise any material that can be used in the color filter without limitation.

In one exemplary embodiment of the present application, the color filter composition may be a solvent-free type containing no solvent.

The color filter according to an exemplary embodiment of the present application uses polydimethylsiloxane and thus has a high viscosity due to the absence of the solvent for the dispersion of the pigment, and the color filter can be directly applied on the fluorescent film without a complicated process comprising forming a color filter on an additional substrate and applying the resulting color filter to the fluorescent film.

In one exemplary embodiment of the present application, the direct coating is a bar-coating or a comma-coating process.

The color filter according to an exemplary embodiment of the present application uses polydimethylsiloxane, thereby enabling the color filter and the fluorescent film to be formed in the same coater. That is, conventional color filters comprise an acrylic binder, thereby having a disadvantage associated with the manufacturing process in that the color filter and the fluorescent film cannot be manufactured in the same coater due to the great difference in viscosity between the acrylic binder included in the color filter and the polydimethylsiloxane included in the fluorescent film. However, the color filter according to an exemplary embodiment of the present invention comprises polydimethylsiloxane, thereby solving the above problem.

The vehicle lamp described herein may comprise headlights (headlamps), taillights, vehicle lights, fog lights, turn indicators, brake lights, emergency lights, backup lights (tail lamps) and the like. However, the configuration according to the exemplary embodiment described herein may be applied to any device that enables display, even new products developed in the future.

Hereinafter, specific examples of the present invention will be described in more detail such that those skilled in the art to which the present invention pertains can easily implement the examples. However, the present invention can be implemented in various forms and is not limited to the examples described herein.

Preparation Example 1

Preparation Example 1—Formation of Laminate for Vehicle Lamps

Coating of Light-Diffusing Layer
PDMS (Shin-etsu Chemical Co., Ltd., KE-106) was bar-coated or comma-coated on a PET substrate and was then cured at 150° C. for 5 to 10 minutes, and then a light-diffusing layer having a final thickness of 400 μm after curing was formed.

Coating of Fluorescent Film

PDMS (Shin-etsu Chemical Co., Ltd., KE-106) and 50 parts by weight of a fluorescent material, based on 100 parts by weight of the PDMS, were mixed, and the resulting mixture was bar-coated or comma-coated on the cured light-diffusing layer and then cured at 150° C. for 5 to 10 minutes. Then, a laminate of the light-diffusing layer and the fluorescent film having a final fluorescent film thickness of 100 μm after curing was formed.

Coating of Color Filter

PDMS (Shin-etsu Chemical Co., Ltd., KE-106) and 0.9 parts by weight of a pigment, based on 100 parts by weight of the PDMS, were mixed, and the resulting mixture was bar-coated or comma-coated on the fluorescent film of the cured laminate of the light-diffusing layer and the fluorescent film, and then cured at 150° C. for 5 to 10 minutes. Then, a laminate for vehicle lamps having a final color filter thickness of 100 nm after curing was formed.

Preparation Example 2—Formation of Laminate for Vehicle Lamps

Coating of Fluorescent Film

PDMS (Shin-etsu Chemical Co., Ltd., KE-106) and 10 parts by weight of a fluorescent material, based on 100 parts by weight of the PDMS, were mixed, and the resulting mixture was bar-coated or comma-coated on a PET substrate and then cured at 150° C. for 5 to 10 minutes. Then, a fluorescent film having a final thickness of 500 nm after curing was formed.

Coating of Color Filter

PDMS (Shin-etsu Chemical Co., Ltd., KE-106) and 0.9 parts by weight of a pigment, based on 100 parts by weight of the PDMS, were mixed, and the resulting mixture was bar-coated or comma-coated on the cured fluorescent film and then cured at 150° C. for 5 to 10 minutes. Then, a laminate for vehicle lamps having a final color filter thickness of 100 μm after curing was formed.

Preparation Example 3—Formation of Laminate for Vehicle Lamps

Coating of Color Filter

An acrylic binder containing a pigment mill base was coated by a slot-die method on a PET substrate and then dried at 150° C. for 20 minutes and then a color filter having a final thickness of 100 μm after drying was formed.

Coating of Fluorescent Film

PDMS (Shin-etsu Chemical Co., Ltd., KE-106) and 50 parts by weight of a fluorescent material, based on 100 parts by weight of the PDMS, were mixed, and the resulting mixture was bar-coated or comma-coated on the prepared color filter and then cured at 150° C. for 5 to 10 minutes. Then, a laminate of the color filter and the fluorescent film having a final fluorescent film thickness of 100 μm was formed.

Coating of Light-Diffusing Layer

PDMS (Shin-etsu Chemical Co., Ltd., KE-106) was bar-coated or comma-coated on one surface of the fluorescent film of the cured laminate of the color filter and the fluorescent film and then was cured at 150° C. for 5 to 10 minutes, and then a light-diffusing layer having a final thickness of 400 μm after curing was formed.

Experimental Example

1. Evaluation of Luminance and Color of Transmitted Light

For the laminates for vehicle lamps prepared in Preparation Examples 1 to 3, the light emitted from the light-emitting element and transmitted to the final color filter was measured using SR-UL2 equipment produced by Topcon Corporation, and the measurement result is shown in Table 1 below.

TABLE 1

| | Structure | | | Performance | | |
|---|---|---|---|---|---|---|
| | Light-diffusing layer | Fluorescent film | Color filter | Luminance (nit) | Dominant wavelength (nm) | Color purity (%) |
| Example 1 (Preparation Example 1) | PDMS | PDMS + fluorescent material | PDMS + pigment | 4384 | 620.8 | 99.1 |
| Example 2 (Preparation Example 2) | — | PDMS + fluorescent material | PDMS + pigment | 4229 | 620.4 | 99.0 |
| Comparative Example 1 (Preparation Example 3) | PDMS | PDMS + fluorescent material | Acryl + pigment | 4328 | 620.0 | 99.6 |

As can be seen in Table 1, even when PDMS is applied as a color filter to a vehicle lamp, the dominant wavelength and color purity are maintained, and the luminance performance is equivalent when compared to the conventional acrylic material. FIG. 3 is a graph showing the dominant wavelength in Example 1, Example 2 and Comparative Example 1 of the present application. As can be seen in FIG. 3, even when PDMS is applied as a color filter, the dominant wavelength and color purity are maintained, and luminance performance is equivalent when compared to the conventional acrylic material, and the vehicle lamp according to an embodiment of the present application provides an advantage in terms of the manufacturing process in which to the fluorescent film and the color filter comprise the same binder of polydimethylsiloxane (PDMS), and thus the color filter can be directly coated on the fluorescent film without using a solvent and a dispersant.

2. Evaluation of Haze and Transmittance

Regarding the laminates for vehicle lamps prepared in Preparation Examples 1 to 3, the haze and transmittance of the prepared color filter were measured in accordance with the American Society of Testing Materials (ASTM) method using an NDH-5000SP haze meter, and each measurement result is shown in Table 2 below.

TABLE 2

| | Color filter | Haze (%) |
|---|---|---|
| Example 1 (Preparation Example 1) | PDMS + pigment | 42.15 |
| Example 2 (Preparation Example 2) | PDMS + pigment | 42.15 |
| Comparative Example 1 (Preparation Example 3) | Acryl + pigment | 5.26 |

As can be seen in Table 2, the haze value of the color filter using PDMS is higher than that of the conventional acrylic color filter. High haze is advantageous for improving concealment of light-emitting elements in vehicle lamps because light is scattered from the inside. Excessively high haze may cause a decrease in luminance, but only contributes to the improvement of concealment without affecting optical performance, as can be seen from the result of Table 1.

In particular, when using the PDMS material as a color filter, as shown in Example 2, although the light-diffusing layer is removed and the thickness of the fluorescent layer is increased, the optical performance and the concealment of the light-emitting element for vehicle lamps are maintained.

That is, in the vehicle lamp according to the present application, the fluorescent film and the color filter comprise the same binder of polydimethylsiloxane (PDMS), thus enabling the color filter to be directly coated on the fluorescent film without using a solvent and a dispersant, and thus providing an advantage in terms of the manufacturing process compared to the case of using acryl. In addition, the vehicle lamp according to one embodiment of the present application contains the same material in the light-diffusing layer, the fluorescent film and the color filter, thus advantageously resisting deformation such as warping or twisting and providing excellent optical performance.

The invention claimed is:

1. A vehicle lamp comprising a lower substrate, a light-diffusing layer, a fluorescent film and a color filter stacked in this order,
    wherein each of the light-diffusing layer, the fluorescent film and the color filter comprises polydimethylsiloxane (PDMS), and
    wherein the light-diffusing layer is in contact with the fluorescent film.

2. The vehicle lamp of claim 1, wherein the lower substrate comprises a substrate, a first electrode, a first insulating film comprising a light-emitting element, and a second insulating film comprising a second electrode stacked in this order,
    wherein the second insulating film comprises a first surface in contact with the first insulating film and a second surface opposite to the first surface,
    wherein the fluorescent film comprises a first surface in contact with the color filter and a second surface opposite to the first surface, and
    wherein the second surface of the second insulating film and the second surface of the fluorescent film are in contact with each other.

3. The vehicle lamp of claim 2, wherein the substrate is selected from the group consisting of polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

4. The vehicle lamp of claim 1, wherein the color filter has a thickness of 50 μm or more and 150 μm or less.

5. The vehicle lamp of claim 1, wherein the fluorescent film has a thickness of 100 μm or more and 1,000 μm or less.

6. The vehicle lamp of claim 1, wherein the color filter further comprises a pigment, and
    wherein the pigment is present in an amount of 0.5 parts by weight to 2 parts by weight based on 100 parts by weight of the polydimethylsiloxane (PDMS).

7. The vehicle lamp of claim 1, wherein the fluorescent film further comprises a fluorescent material, and
    wherein the fluorescent material is present in an amount of 5 parts by weight to 50 parts by weight based on 100 parts by weight of the polydimethylsiloxane (PDMS).

* * * * *